United States Patent
Oppermann et al.

(10) Patent No.: US 9,083,315 B2
(45) Date of Patent: Jul. 14, 2015

(54) CIRCUIT CONFIGURATION FOR ELIMINATING EMC INTERFERENCE

(75) Inventors: Christian Oppermann, Amberg (DE); Bernhard Streich, Amberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 357 days.

(21) Appl. No.: 12/810,682

(22) PCT Filed: Dec. 28, 2007

(86) PCT No.: PCT/EP2007/011466
§ 371 (c)(1),
(2), (4) Date: Jun. 25, 2010

(87) PCT Pub. No.: WO2009/083021
PCT Pub. Date: Jul. 9, 2009

(65) Prior Publication Data
US 2010/0283554 A1    Nov. 11, 2010

(51) Int. Cl.
*H03K 17/082* (2006.01)
*H03H 19/00* (2006.01)
(Continued)

(52) U.S. Cl.
CPC ............. *H03H 19/008* (2013.01); *H02K 11/02* (2013.01); *H05K 1/0216* (2013.01)

(58) Field of Classification Search
CPC ... H02K 11/02; H03H 19/008; H05K 1/0216; H02M 1/14; H02M 3/156; H02M 1/36; G05F 1/445; H02H 9/001; H02H 9/025; H03K 17/0822
USPC .................. 323/223, 242, 288, 908; 361/93.9; 363/44–46
See application file for complete search history.

(56) References Cited

U.S. PATENT DOCUMENTS 5,559,660 A * 9/1996 Watson et al. .................. 361/58
5,930,130 A * 7/1999 Katyl et al. ..................... 363/53
(Continued)

FOREIGN PATENT DOCUMENTS

DE    2421959 A1    11/1975
EP    1071212 A      1/2001
(Continued)

OTHER PUBLICATIONS

IEEE, IEEE Std 100-2000, Yr. 2000, Digital Object Identifier:10.1109/IEEESTD.2000.322247, p. 693.*
(Continued)

*Primary Examiner* — Jessica Han
*Assistant Examiner* — Gustavo Rosario Benitez
(74) *Attorney, Agent, or Firm* — Harness, Dickey & Pierce, P.L.C.

(57) ABSTRACT

A circuit configuration is disclosed for eliminating EMC interference, and a device includes such a circuit configuration, where a damping member is connected to at least one supply line leading to the consumer or consumers. In at least one embodiment optimal elimination of EMC interference of the electrical consumer or consumers is ensured, and overloading the power supply grid is avoided. To this end, in at least one embodiment the damping member is connected in series with a current-limiting element and can be connected to the consumer in parallel. It is thus possible to compensate for the effect of the current-limiting element and short-circuit said element for the operating state by way of a switch, whereby the element does not cause any loss of power outside of the power circuits and nevertheless has a current-limiting, that is, grid-friendly, effect during the power-up and charging process.

27 Claims, 1 Drawing Sheet

(51) Int. Cl.
*H02K 11/02* (2006.01)
*H05K 1/02* (2006.01)

(56) References Cited

U.S. PATENT DOCUMENTS

| | | | | |
|---|---|---|---|---|
| 5,973,419 | A * | 10/1999 | Kruppa et al. | 307/131 |
| 6,556,406 | B1 | 4/2003 | Matsunaga et al. | |
| 6,646,842 | B2 * | 11/2003 | Pan et al. | 361/58 |
| 6,831,447 | B1 * | 12/2004 | Wittenberg | 323/222 |
| 2002/0196644 | A1 * | 12/2002 | Hwang | 363/89 |
| 2004/0125625 | A1 * | 7/2004 | Nillesen | 363/125 |
| 2004/0263140 | A1 * | 12/2004 | Adragna et al. | 323/282 |
| 2005/0078024 | A1 * | 4/2005 | Harrington | 341/155 |

FOREIGN PATENT DOCUMENTS

| | | |
|---|---|---|
| GB | 856224 A | 12/1960 |
| JP | 2250410 A | 10/1990 |
| WO | WO 2005006519 A1 | 1/2005 |

OTHER PUBLICATIONS

Korean Office Action dated May 27, 2014 for corresponding Korean Application No. 10-2010-7016821.

English translation of Korean Office Action dated Nov. 19, 2013 for corresponding Korean Application No. 10-2010-7016821.

* cited by examiner

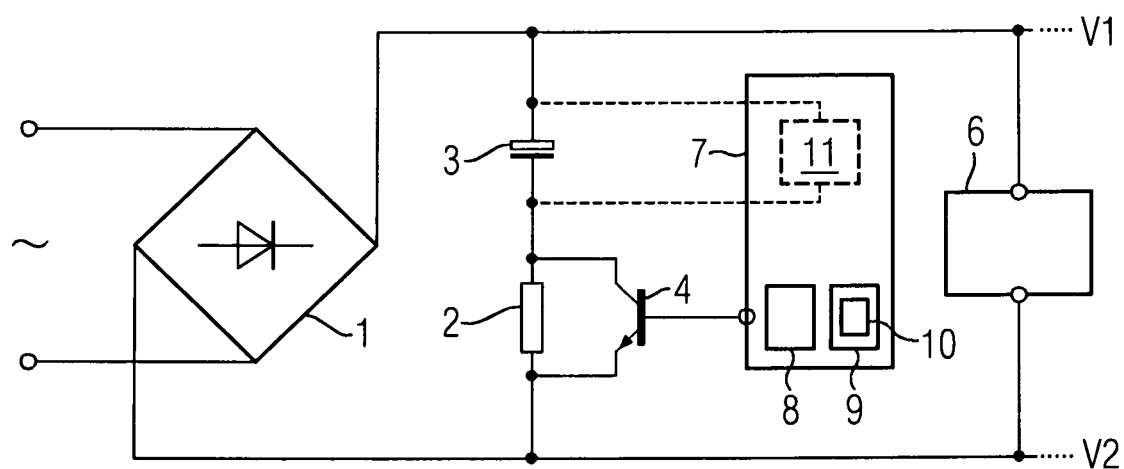

CIRCUIT CONFIGURATION FOR ELIMINATING EMC INTERFERENCE

PRIORITY STATEMENT

This application is the national phase under 35 U.S.C. §371 of PCT International Application No. PCT/EP2007/011466 which has an International filing date of Dec. 28, 2007, which designates the United States of America, the entire contents of each of which are hereby incorporated herein by reference.

FIELD

At least one embodiment of the invention generally relates to a circuit arrangement for eliminating EMC interference of an electrical consumer, where a damping member of the circuit arrangement can be connected to at least one supply line of the electrical consumer. At least one embodiment of the invention further generally relates to a device which has a circuit arrangement of this type for eliminating EMC interference.

BACKGROUND

A circuit arrangement is used for electrical consumers such as for instance a coil control or a switching power supply in conjunction with clocked electronic systems, which can transmit interference signals. Circuit arrangements for electromagnetic compatibility (EMC) are needed to eliminate interference signals of this type particularly in power networks, but also in other areas of application. The circuit arrangements are generally based on a capacitor with a large capacity, which is provided on supply lines, in particular at the input of the circuit to be protected in each instance. The capacitor is used here as a buffer or damper for possible current peaks, which originate from the clocked electronic system. An EMC circuit arrangement can be used as such separately in a module or integrated in a device.

The large capacity of the capacitor, which is used as a damping member, is always problematical if the mains power supply used only permits a limited current consumption. As the capacitor is connected to a supply line, when the device and/or consumer is switched on, into which a circuit arrangement is integrated or arranged upstream thereof, a high charging current develops shortly after switching-on in order to charge the capacitor. It is consequently always necessary to consider whether a capacitor with a large capacity is to be used as a result of the EMC, or whether the loading capacity of the grid, in terms of current, is to limit the capacity of the capacitor.

Inductors or current limiters were previously used in this context, which provided for the charging current in the supply line to be restricted to a tolerable minimum. The disadvantage of this solution lies in the limiting element being located in the energy circuit and permanent losses therefore being generated during operation of a consumer.

WO 2005/006519 A1 discloses a circuit arrangement for eliminating EMC interference of a direct current motor. A circuit arrangement is taught, which provides a damping member for eliminating EMC interference of the DC motor in the lines of the same.

SUMMARY

At least one embodiment of the invention specifies a circuit arrangement and/or a device, which enables a high electromagnetic compatibility with minimal loss of power.

At least one embodiment is directed to a circuit arrangement wherein the damping member, together with a current-limiting element of the circuit arrangement, can be connected in series, parallel to the consumer.

At least one embodiment of the inventive circuit arrangement for eliminating EMC interference of an electrical consumer has a damping member, which functions in the same way as the already known damping members. At least one embodiment of the invention includes a current-limiting element, which is connected in series with the damping member. The damping member and the current-limiting element are both connected in parallel to the consumer or to several consumers arranged downstream thereof. In at least one embodiment, it is important that during the charging process of the damping element, and/or of the capacitor/s contained therein, the charging current is limited by the current-limiting element.

After the charging process, in particular during operation of the consumer or consumers, a loss of power on the current-limiting element is to be prevented. As a result of its parallel arrangement to the consumers, the current-limiting element is not present in the energy circuit and also does not generate any loss of power. For an optimal function of eliminating EMC interference during operation, provision is made for the current-limiting element to be bridgeable by means of a switch, in particular a transistor. Consequently, two statuses of the circuit arrangement can be distinguished. On the one hand, there is the charging state, which lasts until the damping member has reached the desired charging state, and on the other hand an operating state, in which the current-limiting element is bridged by the switch, as a result of which the current-limiting element causes no loss of power during operation of the consumer or consumers.

In an advantageous embodiment, the switch of the circuit arrangement can be triggered by a first controller. The first controller is provided to switch over into the operating state upon termination of the charging process, as a result of which the elimination of EMC interference becomes active. During the charging process, the elimination of EMC interference is not established to the full extent as a result of the current-limiting element, although it is also unnecessary during the charging process.

In an advantageous embodiment, the first controller is provided to bridge the current-limiting element after the charging process of the damping member. The first controller, which functions for instance on the basis of a microprocessor, decides whether to pass from the charging state into the operating state. To this end, the trigger signal is output to bridge the current-limiting element.

The first controller advantageously has a device for time measurement, in particular a counter. The charging process and/or the duration of the same can be determined in advance, so that the first controller only produces the bridging of the current-limiting element on the basis of a time interval. The first controller can herewith be pre-programmed with a fixed time interval, or there is the option of subsequent electronic programming or adjustment of this interval. A manual adjustment takes place for instance by way of a potentiometer circuit, which can be integrated into the first controller for manual control by means of a handle.

In an advantageous embodiment, the first controller has at least one device for detecting a charging state of the damping member. In this embodiment, the first controller detects the charging state of the damping member, in order to evaluate whether the desired charging state, which can be adjusted if necessary, is reached. This can take place for instance by way of a voltage measurement on or in the damping member. The measured voltage value is forwarded to the first controller in order to identify the charging state. As a result, there is an independence of the circuit arrangement from the power network such that different charging times can be readily taken into account without performing an adjustment on the circuit arrangement.

In an advantageous embodiment, the damping element and/or the circuit arrangement is provided in order to replace the damping member. Depending on which elimination of EMC interference is to be realized and/or which EMC level is to be achieved, a corresponding damping member, which has an adjusted capacity for instance, can be manually inserted into the circuit arrangement by the user. The replacement possibility of the damping member allows the circuit arrangement to be used flexibly for different levels of EMC interference elimination.

In an advantageous embodiment, the damping member is provided for damping regulation purposes. Damping-relevant variables, in particular the capacity, can either be regulated manually by the user or a second controller is provided herefor. The second controller can implement the damping regulation from outside of the circuit arrangement and/or device. The same can be achieved by a second controller, which is located inside the circuit arrangement. A very high flexibility is herewith achieved, with it being possible for optimal importance to be attached to the conditions of the power supply network. Furthermore, it is possible for a wholly determined charging state to be provided for normal operation, which has proven optimal for eliminating EMC interference for the respective network.

In an advantageous embodiment, the current-limiting element is provided to regulate a current-limiting overall resistance. This is then particularly meaningful if the current-limiting element is formed with one or several ohmic resistors. The regulation of the current-limiting overall resistance can be manually effected again by the user or automatically by the first or second controller. The length of the charging process can herewith be regulated, with it being possible also to apply this to the performance of the grid.

The second controller is advantageously provided to control the current-limiting overall resistance of the current-limiting element and/or to control the damping regulation of the damping member. The second controller may be a manual controller, an automatic controller and/or identical to the first controller.

Further advantageous embodiments and preferred developments of the invention can be inferred from the description of the Figures and/or the subclaims.

BRIEF DESCRIPTION OF THE DRAWINGS

The invention is described and explained in more detail below with reference to the example embodiments illustrated in the FIGURE.

FIG. 1 shows a circuit arrangement for eliminating EMC interference of an electrical consumer 6 with a rectifier 1.

DETAILED DESCRIPTION OF THE EXAMPLE EMBODIMENTS

FIG. 1 shows a circuit arrangement for eliminating EMC interference of an electrical consumer 6 with a rectifier 1. The rectifier 1 is connected to an ac network 1, with the circuit arrangement for eliminating EMC interference being connected to this by way of the supply lines V1 and V2. The consumer 6 is connected in parallel to the circuit arrangement for eliminating EMC interference.

The rectifier 1 can be connected to an ac network and supplies the consumer 6 with direct current by way of the supply lines V1 and V2. In this example embodiment, the circuit arrangement for eliminating EMC interference consists of the damping member 3, which is embodied as a capacitor 3, the current-limiting element 2, the switch 4 and the controller 7. The circuit arrangement is thus connected between the two supply lines V1 and V2 and/or in parallel with the consumer 6, which is or contains a dc motor, a coil control or a switching power supply for instance.

In this example embodiment, only the two supply lines V1 and V2 are shown, however an inventive circuit arrangement for eliminating EMC interference can also basically be used in multi-phase grids, with the elimination and/or the connection of the circuit arrangement assisting with a synchronous or asynchronous elimination of EMC interference.

The capacitor 3 is used to damp and/or eliminate current peaks, which originate from a clocked electronic system from the grid or from another consumer, which are connected to the supply lines V1, V2. The elimination of EMC interference is active if the current-limiting element 2, which is embodied as an ohmic resistor, has been bridged in a low-resistance fashion by the switch 4. This corresponds to the operating state, for which the elimination of EMC interference is to function optimally.

In the charging state, the charging of the capacitor 3 takes place by means of the power supply grid via the rectifier 1. The current-limiting element 2 provides here for a current flow to the capacitor 3 which is compatible with the grid. Once the desired charging state of the capacitor 3 has been reached, a bridging of the current-limiting element 3 takes place by way of the switch 4.

It is advantageous to charge the capacitor 3 in a current-limited fashion during a charging process, especially while the EMC efficiency is not yet needed. Furthermore, continuous losses in power do not result thanks to the current-limiting element 2, since this is not connected in the energy circuit i.e. in one of the supply lines V1, V2. In other words, an optimal grid adjustment and an optimal elimination of EMC interference are realized separately at different times, with the one function being adjusted to benefit the other as a function of requirements.

In this example embodiment, the controller 7 represents a first controller 7 for triggering the switch 4, which produces the bridging of the current-limiting element 2. In the simplest case, the controller 7 acts in accordance with a time measurement device 9, which can be predetermined by the user after a predetermined time interval and provokes activation of the switch 4. The time measurement device 9 may include a counter 10. The counter 10 begins to run if the circuit arrangement has been connected to the grid and/or to the rectifier 1 and the charging process of the capacitor 3 has thus begun. The first controller may include a detecting device 8 that can detect a charging state of the damping member. For example, the detecting device 8 may detect the charging state of the damping member 3 in order to evaluate whether the desired charging state, which can be adjusted if necessary, is reached. This can take place for instance by way of a voltage measurement on or in the damping member 3. The measured voltage value may be used to identify the charging state. As a result, there is an independence of the circuit arrangement from the power network such that different charging times can be readily taken into account without performing an adjustment on the circuit arrangement.

An optional second controller 11 could also realize a damping regulation such that a capacitor circuit is arranged instead of the capacitor 3, which brings about a regulation of the damping, for instance by way of a regulation of the capacity. The second controller 11 may be integrated in the first controller, as a result of which the controller 7 could assume both functions.

The circuit arrangement can advantageously be realized in the form of a module, which protects the individual consumers and thus also within a grid only by way of the connection of the module to the supply lines.

Similarly, it is advantageous to equip individual consumers, in other words devices such as power supplies, switching power supplies, coil controls or similar devices with circuit arrangements of this type which are integrated therein. The protection is thus tailored to the respective device.

In summary, an embodiment of the invention relates to a circuit arrangement for eliminating EMC interference and/or a device comprising such a circuit arrangement, with a damping member being connected to at least one supply line leading to the consumer or consumers. The aim is to ensure optimal elimination of EMC interference of the electrical consumer or consumers and likewise to avoid overloading the power supply grid. To this end the damping element is to be connected in series with a current-limiting element and can be connected to the consumer in parallel. It is therefore possible to compensate for the effect of the current-limiting element and short-circuit said element for the operating state by means of a switch whereby said element does not cause any loss of power outside of the power circuit and nevertheless has current-limiting, that is, grid-friendly, effect during the power-up and charging process.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A circuit arrangement for eliminating EMC interference of an electrical consumer, comprising:
   a damping member configured to store charge, the damping member connected to at least one supply line of the electrical consumer, the damping member connected in series with a current-limiting element of the circuit arrangement and being connected in parallel to the at least one supply line of the electrical consumer;
   a switch configured to bridge the current-limiting element;
   a first controller, including a microprocessor, configured to,
      output a signal to the switch to trigger the switch, and
      trigger the switch based on whether the damping member has charged to a desired charge level, the desired charge level for the damping member being selected such that a desired EMC level is achieved for the electrical consumer; and
   a second controller configured to control a capacitance of the damping member.

2. The circuit arrangement as claimed in claim 1, wherein the first controller is configured to trigger the switch to bridge the current-limiting element after a charging process in which the damping member charges to the desired charge level.

3. The circuit arrangement as claimed in claim 2, wherein the first controller includes at least one device configured for time measurement.

4. The circuit arrangement as claimed in claim 2, wherein the first controller includes at least one device configured to detect a charging state of the damping member.

5. The circuit arrangement as claimed in claim 1, wherein the damping member includes one of a capacitor and a capacitor circuit.

6. The circuit arrangement as claimed in claim 1, wherein the damping member is provided for damping regulation purposes.

7. The circuit arrangement as claimed in claim 1, wherein the current-limiting element includes one or more ohmic resistors.

8. The circuit arrangement as claimed in claim 1, wherein the current-limiting element is provided to regulate a current-limiting resistance.

9. The circuit arrangement as claimed in claim 1, wherein the second controller is one of a manual controller and an automatic controller.

10. An electrical device comprising:
    a circuit arrangement to eliminate EMC interference of the electrical device, the circuit arrangement including a damping member configured to store charge, the damping member being connected to at least one supply line of the electrical device, the damping member being connected in series with a current-limiting element of the circuit arrangement and in parallel with a device-internal consumer;
    a switch configured to bridge the current-limiting element;
    a first controller, including a microprocessor, configured to,
       output a signal to the switch to trigger the switch, and
       trigger the switch based on whether the damping member has charged to a desired charge level, the desired charge level for the damping member being selected such that a desired EMC level is achieved for the electrical consume; and
    a second controller configured to control a capacitance of the damping member.

11. The device as claimed in claim 10, wherein the first controller is configured to trigger the switch to bridge the current-limiting element after a charging process in which the damping member charges to the desired charge level.

12. The device as claimed in claim 11, wherein the first controller includes at least one device for time measurement.

13. The device as claimed in claim 11, wherein the first controller includes at least one device to detect a charging state of the damping member.

14. The device as claimed in claim 10, wherein the damping member includes one of a capacitor and a capacitor circuit.

15. The device as claimed in claim 10, wherein the damping member is provided for damping regulation purposes.

16. The device as claimed in claim 10, wherein the current-limiting element includes one or several ohmic resistors.

17. The device as claimed in claim 10, wherein the current-limiting element is provided to regulate a current-limiting resistance.

18. The device as claimed in claim 10, wherein the second controller is one of a manual controller and an automatic controller.

19. The device as claimed in claim 10, wherein the device is one of a power supply unit, switching power supply, coil control and EMC module.

20. The circuit arrangement as claimed in claim 3, wherein the at least one device configured for time measurement includes a counter.

21. The circuit arrangement as claimed in claim 1, wherein the first controller is configured to at least one of control the resistance of the current-limiting element and control the damping regulation of the damping member.

22. The device as claimed in claim 11, wherein the at least one device for time measurement includes a counter.

23. The device as claimed in claim 10, wherein the first controller is configured to at least one of control a resistor of the current-limiting element and control the damping regulation of the damping member.

24. The circuit arrangement as claimed in claim 1, wherein the first controller is configured to output the signal to the switch to trigger the switch based on a fixed time interval and the first controller is configured to adjust the fixed time interval.

25. The circuit arrangement as claimed in claim 2, wherein a time interval of the charging process varies.

26. The circuit arrangement as claimed in claim 25, wherein the time interval of the charging process is based on a size of the damping member.

27. The circuit arrangement as claimed in claim 4, wherein the at least one device is configured to measure a voltage on or in the damping member.

* * * * *